(12) United States Patent
Huang et al.

(10) Patent No.: US 8,866,313 B2
(45) Date of Patent: Oct. 21, 2014

(54) SUBSTRATE, SEMICONDUCTOR CONSTRUCTION, AND MANUFACTURING METHOD THEREOF

(71) Applicant: Unistars Corporation, Hsinchu (TW)

(72) Inventors: Tien-Hao Huang, Zhongli (TW);
Hsin-Hsie Lee, Taoyuan County (TW);
Yi-Chun Wu, Miaoli County (TW);
Shang-Yi Wu, Hsinchu (TW)

(73) Assignee: Unistars Corporation, Hsinchu County (TW)

( * ) Notice: Subject to any disclaimer, the term of this patent is extended or adjusted under 35 U.S.C. 154(b) by 0 days.

(21) Appl. No.: 13/798,486

(22) Filed: Mar. 13, 2013

(65) Prior Publication Data

US 2014/0191274 A1    Jul. 10, 2014

(30) Foreign Application Priority Data

Jan. 9, 2013 (TW) .............................. 102100808 U (51) Int. Cl.
  *H01L 23/12* (2006.01)
  *H01L 21/4763* (2006.01)
  *B32B 7/12* (2006.01)
  *H01L 33/00* (2010.01)
  *H01L 33/48* (2010.01)

(52) U.S. Cl.
  CPC ............... *B32B 7/12* (2013.01); *H01L 33/005* (2013.01); *H01L 33/48* (2013.01)
  USPC 257/783; 257/753; 257/E23.16; 257/E21.514; 257/E21.584; 438/628; 438/644; 438/654

(58) Field of Classification Search
  USPC .................... 257/753, 783, E23.16, E21.514, 257/E21.584; 438/628, 644, 654
  See application file for complete search history.

(56) References Cited

U.S. PATENT DOCUMENTS 5,635,115 A * 6/1997 Konishi et al. ................. 264/1.7
5,821,613 A * 10/1998 Takashima et al. ........... 257/676
8,314,479 B2 * 11/2012 Wai et al. ....................... 257/676

* cited by examiner

*Primary Examiner* — Jasmine Clark
(74) *Attorney, Agent, or Firm* — Alan Kamrath; Kamrath IP Lawfirm, P.A.

(57) ABSTRACT

A substrate includes a die-bonding zone and a glue spreading pattern. The die-bonding zone is set to bond a die. The glue spreading pattern is placed in the die-bonding zone and includes a containing space. The die is placed on the glue spreading pattern, an area of a bottom of the die is greater than an area of an opening of the glue spreading pattern, the containing room of the glue spreading pattern is filled with a glue, and the die is bonded to the substrate by means of the glue.

21 Claims, 12 Drawing Sheets

SUBSTRATE, SEMICONDUCTOR CONSTRUCTION, AND MANUFACTURING METHOD THEREOF

CROSS-REFERENCE TO RELATED APPLICATION

This application claims priority from Taiwan Patent Application No. 102100808, filed on Jan. 9, 2013, the contents of which are hereby incorporated by reference in their entirety for all purposes.

FIELD OF THE INVENTION

The present invention relates to a substrate for bonding a die, and more particularly, to a substrate having a glue spreading pattern for containing and spreading the glue so as to bond the die onto the substrate by the glue.

BACKGROUND OF THE INVENTION

Figure 1:
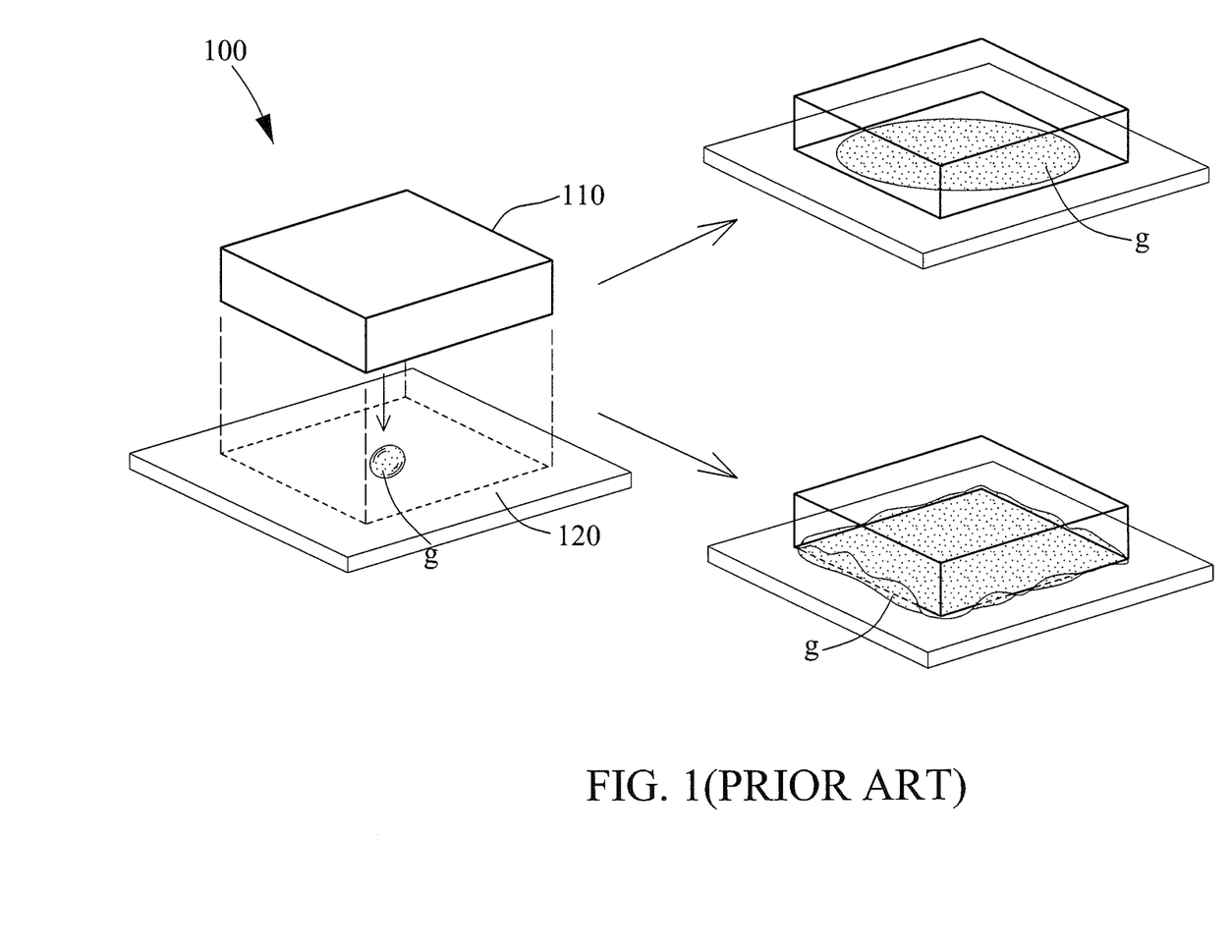
FIG. 1 is a diagram illustrating the packaging process of a semiconductor construction in the prior art.

Please refer to FIG. 1. FIG. 1 is a diagram illustrating the packaging process of a semiconductor construction 100 in the prior art. The semiconductor construction 100 comprises a die 110 and a substrate 120. The die 110 is bonded onto the substrate 120 by the glue g. More particularly, a layer of the glue g is dispensed on the substrate 120, then the die 110 is placed onto the glue g and pressed, so as to bond the die 110 onto the substrate 100 and form the semiconductor construction 100. Since the glue g is liquid, the glue g would expand from the center to the outward on the substrate 120 when the glue g is pressed by the die 110 and the substrate 120. However, this might lead to two scenarios: 1. If the volume of the glue g is insufficient, since the expanding shape of the glue g is circular and the shape of die is rectangular, the periphery of the die 110 (especially the corners of the die 110) may not be able to fully contact with the glue g, which deteriorates the stability of the bonding of the die 110 on the substrate 120 (as shown in top right of FIG. 1); 2. If the volume of the glue g is too much, though the periphery of the die 110 can fully contact with the pressed glue g, the redundant glue g would overflow onto the periphery of the die 110, which affects the performance of the die 110 (as shown in bottom right of FIG. 1). For instance, if the die 110 is a light emitting diode (LED) which can emit light from its front and lateral sides, the light emitted from the laterals of the LED would be shielded by the glue g, thereby downgrading the efficiency of the LED. Besides, in the prior art, the volume of the glue g is hard to be set precisely, which means two scenarios above occur frequently, and therefore it is difficult to bond the die 110 onto the substrate 120 by the glue g effectively, making trouble for the manufacturer.

SUMMARY OF THE INVENTION

The present invention provides a substrate and a semiconductor construction. The substrate comprises a die-bonding zone for carrying a die; a glue spreading pattern disposed in the die-bonding zone, and the die is disposed above the glue spreading pattern; and a glue disposed in the die-bonding zone to fix the die onto the substrate, wherein the glue is dispensed between a bottom of the die and the glue spreading pattern. The semiconductor construction comprises the above said substrate, an LED placed in the die-bonding zone, and a transparent epoxy. The transparent glue like epoxy or silicone types is placed in the die-bonding zone for covering the LED and guiding light emitted from the LED.

The present invention further provides a manufacturing method for a semiconductor construction. The manufacturing method comprises:

(a) providing a substrate;
(b) disposing a die-bonding zone in the substrate for carrying a die;
(c) disposing a glue spreading pattern in the die-bonding zone;
(d) disposing a glue in the die-bonding zone; and
(e) placing the die on the die-bonding zone of the substrate and pressing the die so as to bond the die on the substrate by means of the glue; wherein in step (e), the glue flows along the glue spreading pattern so as to spread on the back of the die instead of the laterals of the die.

These and other objectives of the present invention will no doubt become obvious to those of ordinary skill in the art after reading the following detailed description of the preferred embodiment that is illustrated in the various figures and drawings.

DETAILED DESCRIPTION OF THE INVENTION

Figure 2:
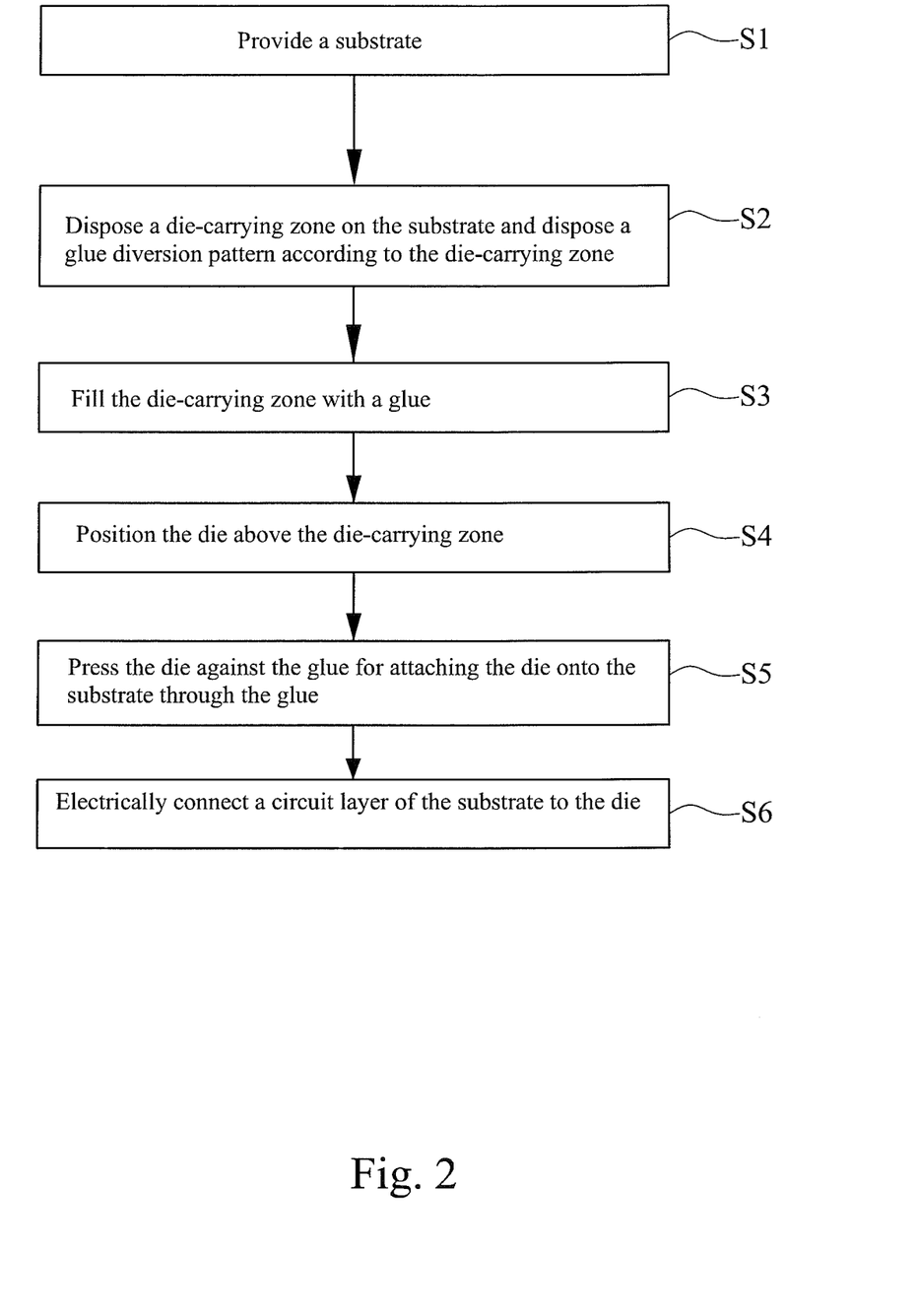
FIG. 2 is a flowchart illustrating the manufacturing method of a semiconductor construction according to an embodiment of the present invention.

Please refer to FIG. 2. FIG. 2 is a flowchart illustrating the manufacturing method for a semiconductor construction according to an embodiment of the present invention. The steps of the manufacturing method are described as follows:

Step S1: Provide a substrate;
Step S2: Dispose a die-bonding zone on the substrate and dispose a glue spreading pattern according to the die-bonding zone;
Step S3: Fill the die-bonding zone with a glue;
Step S4: Position the die on the die-bonding zone;
Step S5: Press the die so as to bond the die on the substrate by means of the glue;
Step S6: Electrically connect a circuit layer of the substrate to the die.

In Step S5, when the die is pressed, the glue would be constrained within the glue spreading pattern so as to spread on the back of the die instead of the laterals of the die.

Figure 3:
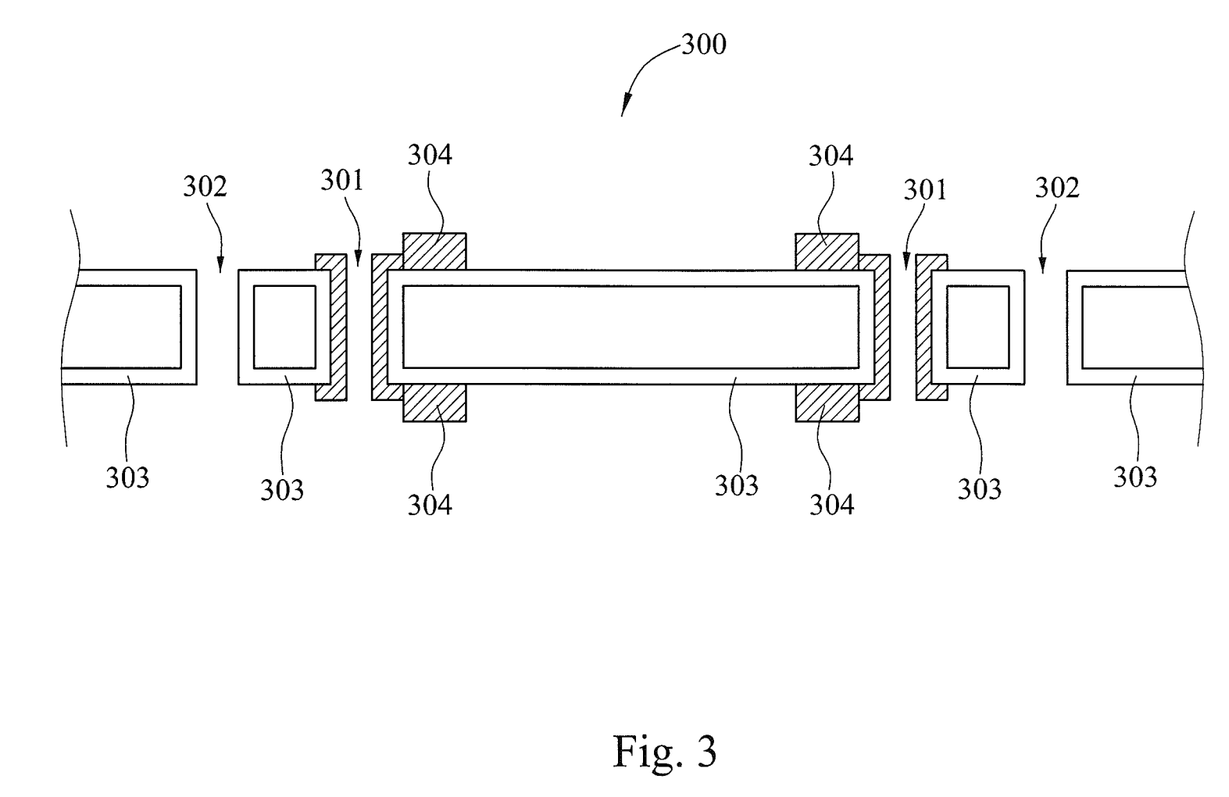
FIG. 3 is a diagram illustrating a substrate according to an embodiment of the present invention.

In step S1, a substrate is provided. Please refer to FIG. 3. FIG. 3 is a diagram illustrating a substrate 300 according to an embodiment of the present invention. The substrate 300 comprises a top surface and a bottom surface. Preferably, the substrate 300 can be disposed with through holes 301 for electrically connection, scribing lines 302, an insulation layer 303, and a circuit layer 304 . . . and so on. The insulation layer 303 is disposed on the surface of the substrate 300, the circuit layer 304 is mainly disposed on the top surface and the bottom surface of the substrate 300, the through holes 301 are disposed for electrical connection of the circuit layer 304 on the top surface of the substrate 300 to the circuit layer 304 on the bottom surface of the substrate 300, and the scribing lines 302 are disposed for scribing the semiconductor construction into a plurality of semiconductor units.

Figure 4:
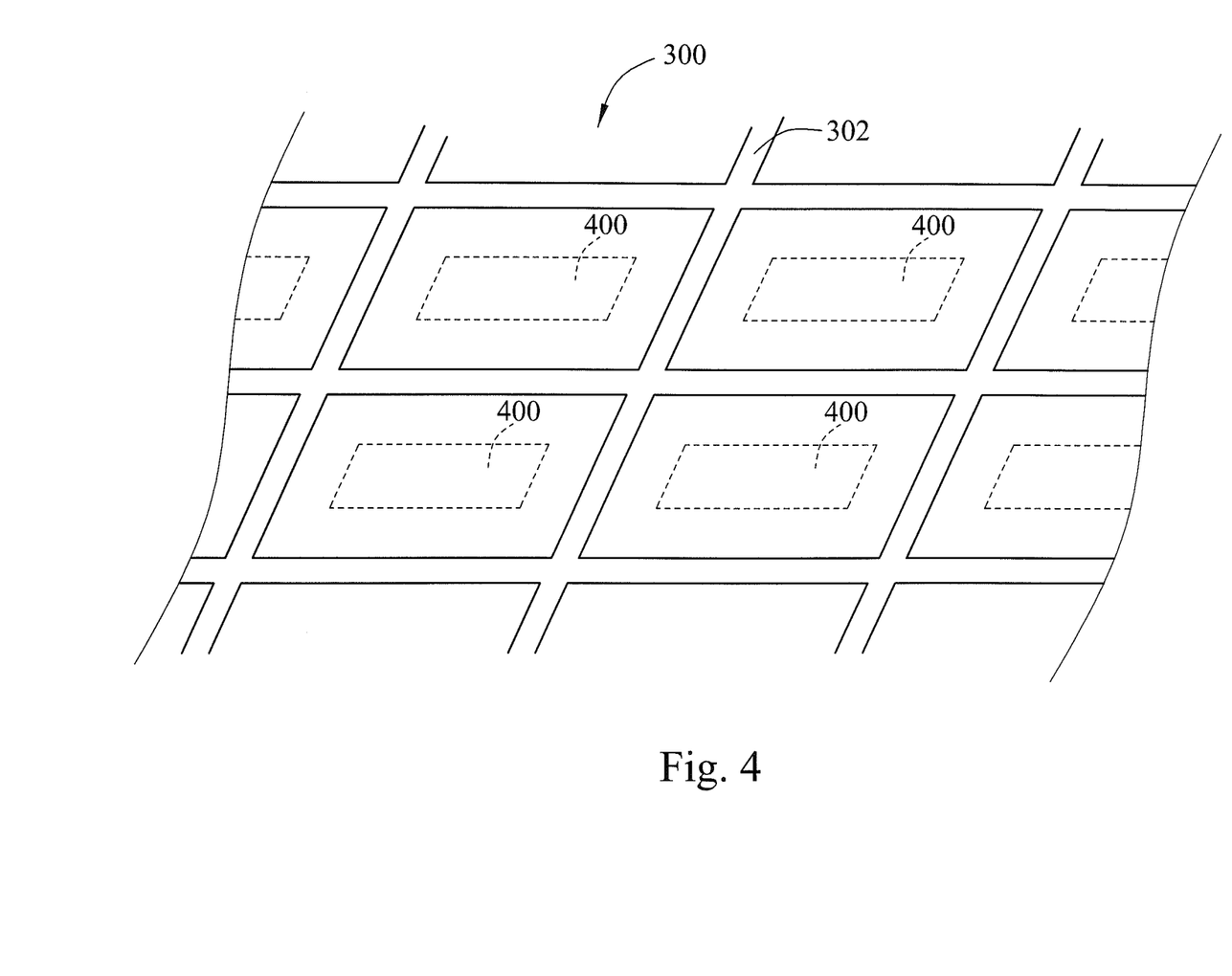
FIG. 4 is a diagram illustrating a die-bonding zone according to an embodiment of the present invention.
Figure 5A:
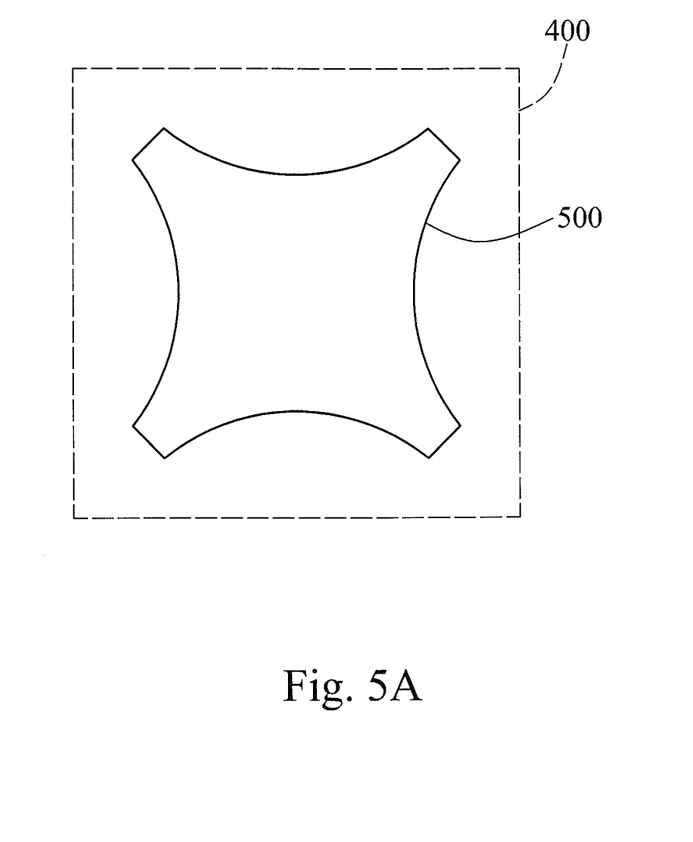
FIG. 5A, and FIG. 5B are diagrams illustrating a glue spreading pattern according to an embodiment of the present invention.
Figure 5B:
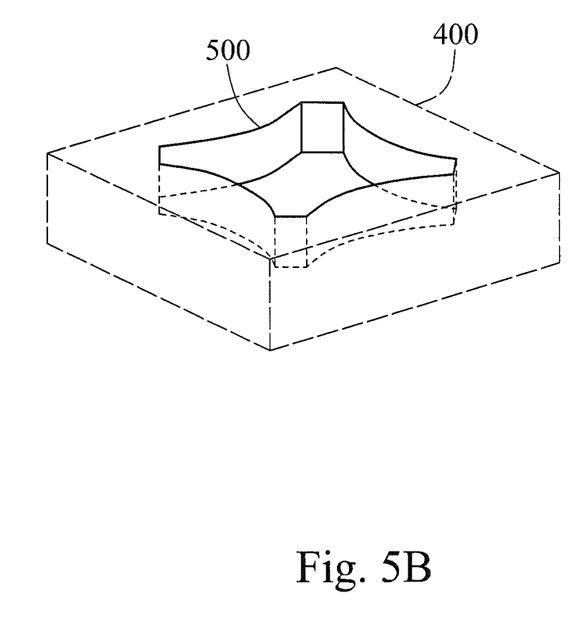

In step S2, a glue spreading pattern 500 and a die-bonding zone 400 are disposed on the substrate 300. Please refer to FIG. 4, FIG. 5A, and FIG. 5B. FIG. 4 is a diagram illustrating a die-bonding zone 400 according to a first embodiment of the present invention. FIG. 5A and FIG. 5B are diagrams illustrating the glue spreading pattern according to an embodiment of the present invention. FIG. 5A is top view of the glue spreading pattern, and FIG. 5B is a perspective view of the glue spreading pattern. In the present embodiment, the glue spreading pattern 500 comprises a cavity.

As shown in FIG. 4, the die-bonding zone 400 is disposed on the top surface of the substrate 300 for bonding a die (the glue spreading pattern 500 is not shown for brevity). Preferably, the size of the die-carrying zone 400 is determined based on the size of the die placed thereon, and the position of the die-carrying zone 400 is determined based on the position of die-carrying zone 400 and the scribing lines 302. In this way, after the semiconductor construction is scribed into a plurality of semiconductor units, each semiconductor unit has its own die-bonding zone 400. Besides, in the present invention, the die to be bonded is assumed to be rectangular, and thus the die-bonding zone 400 is accordingly rectangular. The purpose of disposing the glue spreading pattern is to provide a containing space in the substrate 300 and dispense the glue g which bond the die and the substrate and constrain the glue g in the containing space to avoid glue overflowing onto the periphery of the die. Preferably, the glue spreading pattern 500 comprises an space and the space comprises a specific pattern corresponding to the profile of the bottom surface of the die. For example, if the bottom surface of the die is rectangular, the specific pattern of the opening of the glue spreading pattern 500 can be as the shape as the letter "X", wherein each protruding part of the X-shaped pattern is adjacent to a corresponding corner of the rectangle of the bottom surface of the die. However, the specific pattern of the opening of the glue spreading pattern 500 can be modified according to the profile of the die as long as the modified pattern of the opening can enable the die to be bonded effectively.

In addition, in the present embodiment, the glue spreading pattern 500 and the substrate is formed integrally, for example by using injection molding, stamping molding, or other manufacturing method which the person having ordinary skill in the art is familiar with. Or the glue spreading pattern 500 can be formed by the two following methods: 1. etching the substrate 300, 2. disposing a cavernous construction which is formed by a photoresist layer and protrudes the top surface of the substrate 300 so that a cavity is formed in the cavernous construction to contain the glue g.

Figure 6:
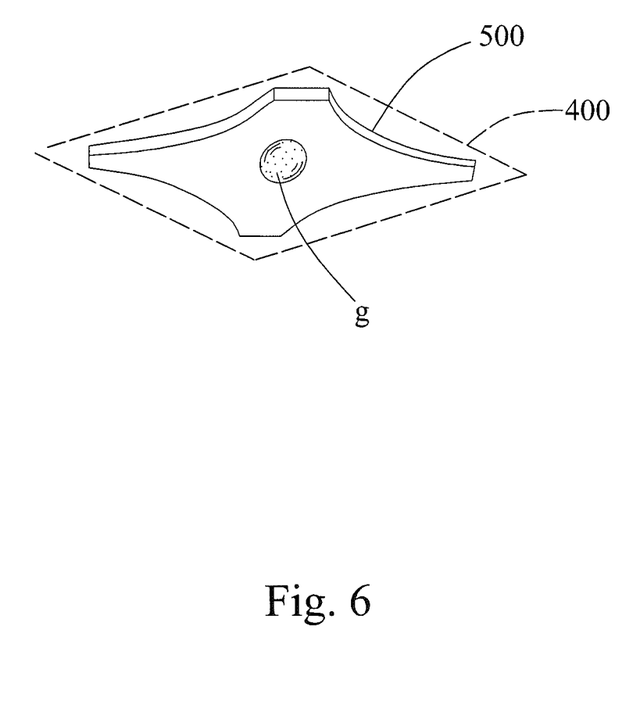
FIG. 6 is a diagram illustrating the glue filling into the glue diversion pattern according to an embodiment of the present invention.

In step S3, the present invention fills the glue spreading pattern 500 with the glue g. Please refer to FIG. 6. FIG. 6 is a diagram illustrating the glue filling into the glue diversion pattern according to an embodiment of the present invention. As shown in FIG. 6, the volume of the glue g has to be set appropriately. Preferably, the volume of the glue g is approximately greater than the containing space of the glue spreading pattern 500, so as to make the overflowed glue g from the glue diversion pattern 500 is dispensed on the bottom surface of the die and the die-carrying zone 400, thereby bonding the die tightly on the substrate 120.

Figure 7:
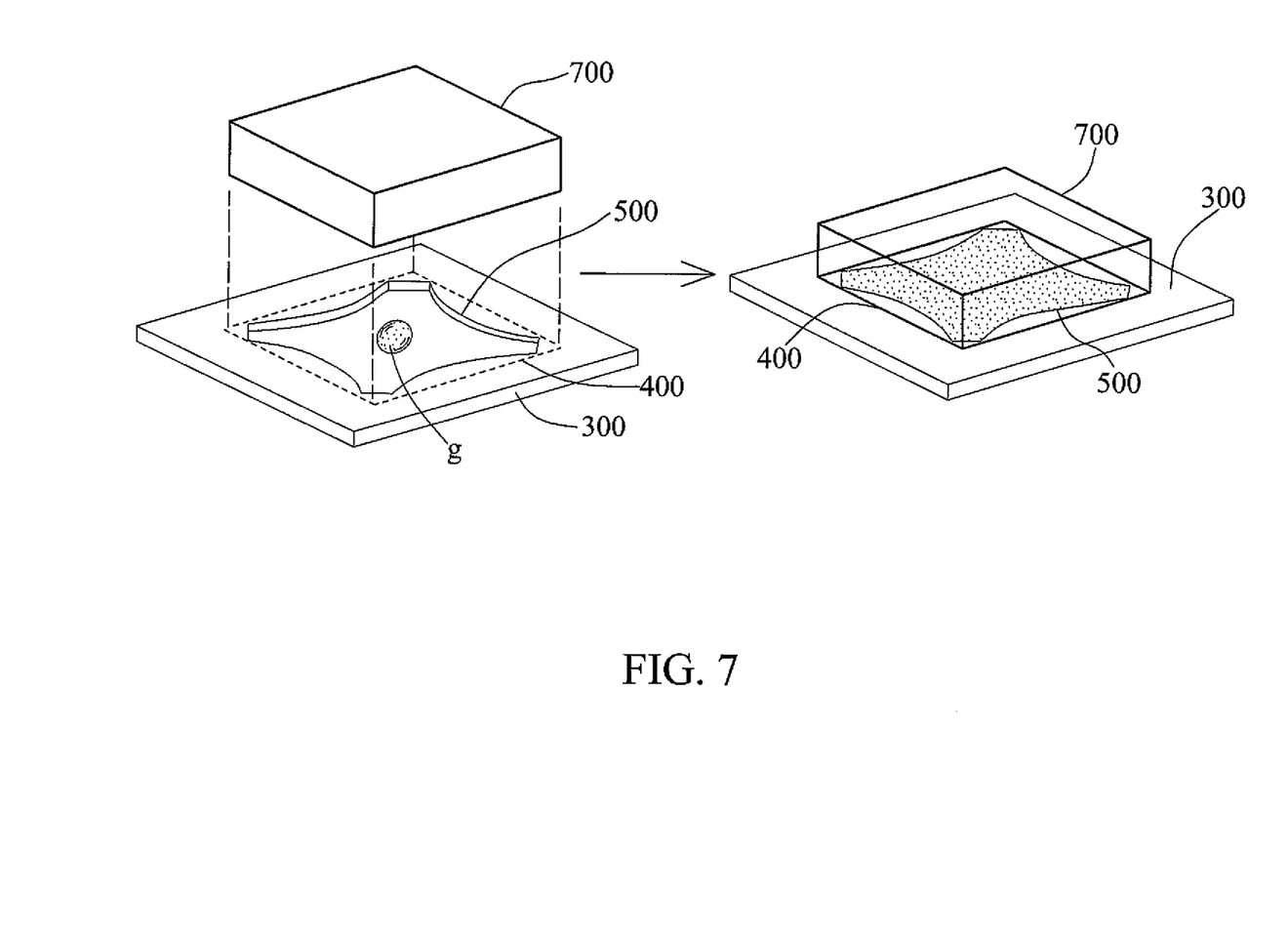
FIG. 7 is a diagram illustrating the die placed on the glue spreading pattern.

In step S4, the present invention places the die on the glue spreading pattern 500. Please refer to FIG. 7. FIG. 7 is a diagram illustrating the die 700 placed on the glue spreading pattern 500. As shown in FIG. 7, the die 700 is rectangular as mentioned above. Preferably, the bottom side of the die 700 is designed to be not larger than the area of the die-bonding zone 400, and the opening of the glue spreading pattern 500 is designed to be smaller than the bottom side of the die 700. In other words, the area of the bottom side of the die 700 is smaller than the area of the die-bonding zone 400, and the area of the opening of the glue spreading pattern 500 is smaller than the area of the bottom surface of the die 700.

In step S5, the die 700 is pressed so as to bond the die on the substrate 300 by means of the glue g. Please refer to FIG. 7. FIG. 7 is a diagram illustrating the die 700 bonded onto the substrate 300 according to an embodiment of the present invention. As shown in FIG. 7, after the die 700 is placed on the die-bonding zone 400, the die 700 is pressed so that the glue g would expand to each protruding part of the X-shaped opening of the glue spreading pattern 500. In this way, each corner of the bottom side of the die 700 can be contacted with the glue g at the protruding part of the X-shaped opening of the glue spreading pattern 500 and is bonded onto the substrate 300 by means of the glue g, thereby enhancing the bonding between the die 700 and the substrate 300. Meanwhile, the glue g still would not overflow onto the periphery of the die 700 because of the glue spreading pattern 500 after being pressed. In this way, if the die 700 is able to emit light from its front and lateral sides, the light emitted from the laterals of the die 700 can be extracted effectively. In addition, as mentioned in the prior art, the volume of the glue g is hard to set precisely. Thus, in the present invention, the glue spreading pattern 500 of the substrate 300 provides a containing space to contain the glue g, and by means of the opening of the containing space, the problem of insufficient bonding area or glue overflowing can be avoided when the actual volume of the glue is not precisely fitted to that of the containing space.

After the die 700 is firmly bonded onto the substrate 300, step S6 is executed to electrically connect the die 700 and the circuit layer 304 of the substrate 300. In the present embodiment, the die 700 and the circuit layer 304 of the substrate 300 are electrically connected for example, by wire bonding. In this way, the semiconductor construction is completely manufactured.

Figure 8:
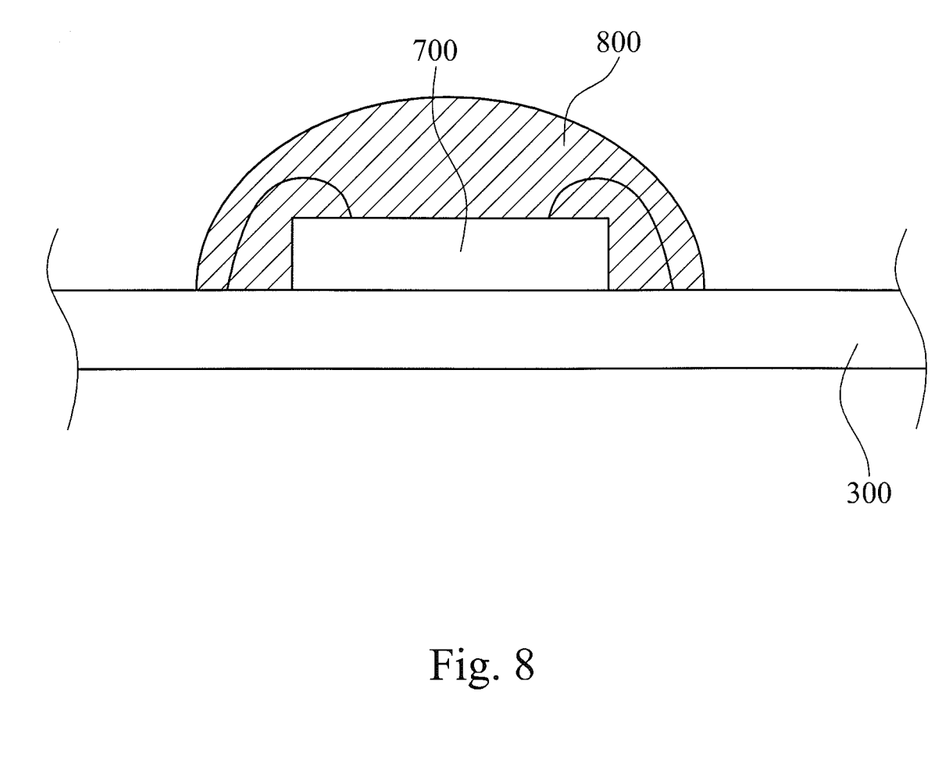
FIG. 8 is a diagram illustrating the transparent glue disposed on the substrate according to an embodiment of the present invention.

Furthermore, when the die 700 is an LED, the present invention disposes a transparent glue 800 on the substrate 300. Please refer to FIG. 8. FIG. 8 is a diagram illustrating the transparent glue 800 disposed on the substrate 300 according to an embodiment of the present invention. As shown in FIG. 8, after the die 700 is bonded onto the substrate 300, a transparent glue 800 is further disposed on the substrate 800 and covers the die 700. The main purpose of the transparent glue 800 is to protect the die 700 and guide the light emitted from the die 700 (LED) to increase the efficiency of the LED.

Figure 9A:
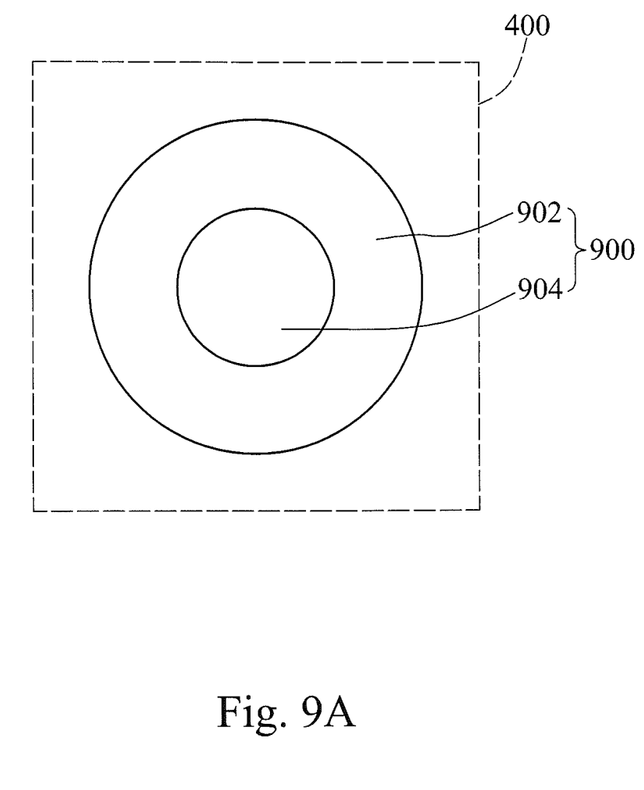
FIG. 9A and FIG. 9B are diagrams illustrating the glue spreading pattern according to a second embodiment of the present invention.
Figure 9B:
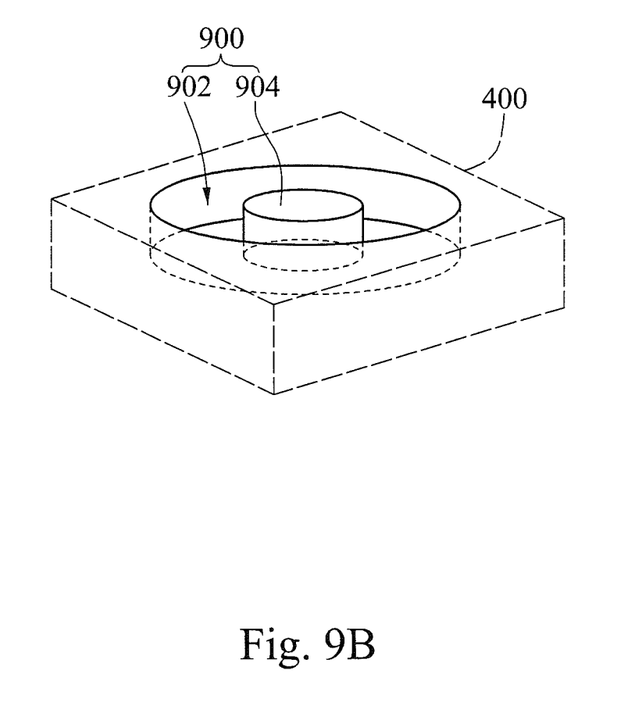

FIG. 9A and FIG. 9B are diagrams illustrating the glue spreading pattern 900 according to a second embodiment of the present invention. FIG. 9A is top view of the glue spreading pattern 900, and FIG. 9B is a perspective view of the glue spreading pattern 900. As shown in FIGS. 9A and 9B, the glue spreading pattern 900 comprises a circular cavity 902, which surrounds a central block 904. Thus, when the die 700 is bonded on the die-bonding zone 400, the glue is dispensed on the central block 904 first, and then the die 700 is pressed. In this way, the glue would flow into the circular cavity 902 instead of the side of the die 700, which avoids the lateral light of the die 700 being shielded.

Figure 10:
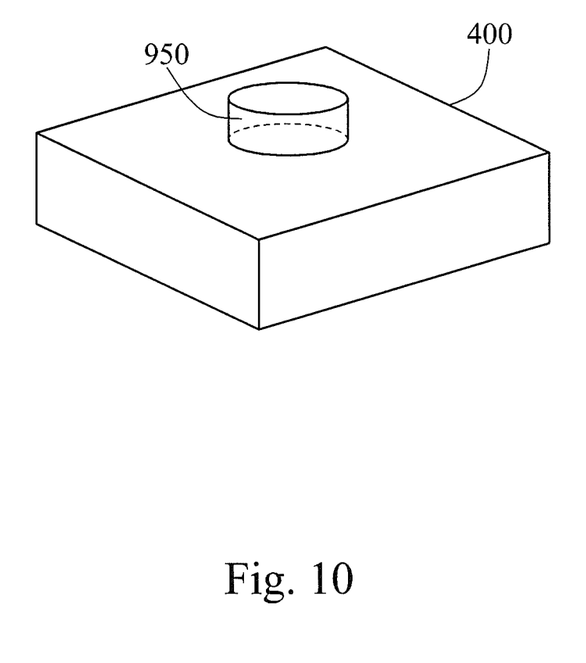
FIG. 10 is a diagram illustrating the glue spreading pattern according to a third embodiment of the present invention.

Please refer to FIG. 10. FIG. 10 is a diagram illustrating a glue spreading pattern according to a third embodiment of the present invention. In the present embodiment, the glue spreading pattern is an island-like protrusion 950, and the surface area of the island-like protrusion 950 is just smaller than the area of the bottom of the die 700. In the process of bonding the die 700 onto the die-bonding zone 400, the glue is dispensed on the island-like protrusion 950 and then the die 700 is pressed. In this way, the residual glue flows along the wall of the island-like protrusion 950 instead of the side of the die 700, avoiding the light from the lateral side of the die 700 being shielded.

To sum up, the glue spreading pattern provided by the present invention effectively reduces the chance of the glue overflowing onto the lateral sides of the die and enhances the bonding between the die and the substrate. In this way, when the die is an LED, the light emitted from lateral sides of the LED is not shielded by the overflowed glue and thus the efficiency of the LED can be increased.

Those skilled in the art will readily observe that numerous modifications and alternatives of the device and method may be made while retaining the teachings of the invention. Accordingly, the above disclosure should be construed as limited only by the meters and bounds of the appended claims.

What is claimed is:

1. A substrate, comprising:
   a die-bonding zone for bonding a die, with the die comprising a plurality of laterals;
   a glue spreading pattern disposed in the die-bonding zone, and the die disposed above the glue spreading pattern; and
   a glue disposed in the die-bonding zone to bond the die onto the die-bonding zone, wherein the glue is bonded between a bottom of the die and the glue spreading pattern;
   wherein the glue spreading pattern is configured to make the glue spread on the back of the die and prevent the glue overflowing to the laterals of the die.

2. The substrate of claim 1, wherein the die is a Light Emitting Diode.

3. The substrate of claim 1, wherein the glue spreading pattern comprises a cavity.

4. The substrate of claim 1, wherein the glue spreading pattern comprises an island-like protrusion.

5. The substrate of claims 1, wherein the bottom of the die is rectangular, the glue spreading pattern comprises a specific pattern, the specific pattern is X-shaped, and a protruding part of the X-shaped pattern is adjacent to a corner of the bottom.

6. The substrate of claims 1, wherein the glue spreading pattern comprises a circular cavity and a central block, the circular cavity surrounds the central block, and the glue is bonded between the bottom of the die and the central block.

7. The substrate of claims 1, wherein an area of the bottom of the die is greater than an area which the glue spreading pattern contacts the die by.

8. A semiconductor construction comprising:
   a substrate, comprising:
   a die-bonding zone to bond a die, with the die comprising a plurality of laterals;
   a glue spreading pattern disposed in the die-bonding zone, and the die disposed above the glue spreading pattern; and
   a glue disposed in the die-bonding zone to bond the die onto the die-bonding zone, wherein the glue is dispensed between a bottom of the die and the glue spreading pattern, and the glue spreading pattern is configured to make the glue spread on the back of the die and prevent the glue overflowing to the laterals of the die; and
   a transparent glue placed in the die-bonding zone to cover the die and guide the light emitted from the die.

9. The semiconductor construction of claim 8, wherein the die is a Light Emitting Diode.

10. The semiconductor construction of claim 8, wherein the glue spreading pattern comprises a cavity.

11. The semiconductor construction of claim 8, wherein the glue spreading pattern comprises an island-like protrusion.

12. The semiconductor construction of claim 8, wherein the bottom of the die is rectangular, the glue spreading pattern comprises a specific pattern, the specific pattern is X-shaped, and a protruding part of the X-shaped pattern is adjacent to a corner of the bottom.

13. The semiconductor construction of claim 8, wherein the glue spreading pattern comprises a circular cavity and a central block, the circular cavity surrounds the central block, and the glue is dispensed between the bottom of the die and the central block.

14. The semiconductor construction of claim 8, wherein an area of the bottom of the die is greater than an area which the glue spreading pattern contacts the die by.

15. A manufacturing method for a semiconductor construction, comprising:
   (a) providing a substrate;
   (b) disposing a die-bonding zone in the substrate to bond a die;
   (c) disposing a glue spreading pattern in the die-bonding zone;
   (d) disposing a glue in the die-bonding zone; and
   (e) placing the die on the die-bonding zone of the substrate and pressing the die so as to bond the die on the substrate by means of the glue;
   wherein in step (e), the glue flows along the glue spreading pattern so as to spread on the back of the die instead of the laterals of the die.

16. The method of claim 15, wherein the die is an LED.

17. The method of claim 16, further comprising:
   (f) providing a transparent glue to cover the LED and guide light emitted from the LED.

18. The method of claim 15, wherein the glue spreading pattern is made with the substrate integrally.

19. The method of claim 15, wherein the glue spreading pattern is formed by etching or lithography process.

20. The method of claims 19, wherein the die has a rectangular bottom, the glue spreading pattern is an X-shaped pattern, and a protruding part of the X-shaped pattern is adjacent to a corner of the bottom.

21. The method of claim 15, wherein area of the bottom of the die is greater than area of the glue spreading pattern contacting the die.

* * * * *